United States Patent
Yao et al.

(10) Patent No.: US 7,208,806 B2
(45) Date of Patent: Apr. 24, 2007

(54) MICROMACHINED ELECTROMECHANICAL DEVICE

(75) Inventors: Kui Yao, Singapore (SG); Xujiang He, Singapore (SG); Jian Zhang, Singapore (SG); Santiranjan Shannigrahi, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 11/273,827

(22) Filed: Nov. 14, 2005

(65) Prior Publication Data

US 2006/0068564 A1    Mar. 30, 2006

Related U.S. Application Data

(62) Division of application No. 10/619,923, filed on Jul. 15, 2003, now Pat. No. 7,018,862.

(51) Int. Cl.
*H01L 27/14* (2006.01)
*B23Q 3/157* (2006.01)

(52) U.S. Cl. .......... 257/414; 438/800; 483/20
(58) Field of Classification Search ........ 257/414; 438/800; 156/272.4, 279
See application file for complete search history.

(56) References Cited

U.S. PATENT DOCUMENTS

| 5,962,081 A | 10/1999 | Ohman et al. ............ 427/534 |
| 6,093,579 A | 7/2000 | Sathe ........................ 438/53 |
| 6,265,750 B1 | 7/2001 | Feng et al. ............... 257/414 |
| 6,612,535 B1 | 9/2003 | Tai et al. .................... 251/11 |

*Primary Examiner*—W. David Coleman
(74) *Attorney, Agent, or Firm*—Hogan & Hartson LLP (57) ABSTRACT

A method for fabricating a MEMS device comprises providing a substrate having a back side, a front side opposite to the back side and a periphery portion. A desired microstructure is formed on the back side of the substrate. The substrate is then supported for rotation. A precursor solution is deposited on the front side of the substrate during rotation so that a thin film layer may be formed thereon. During formation of the thin film layer, the substrate is supported and rotated that the microstructure formed on the back side is protected.

9 Claims, 7 Drawing Sheets

MICROMACHINED ELECTROMECHANICAL DEVICE

CROSS-REFERENCE TO RELATED APPLICATION

This is a divisional of application Ser. No. 10/619,923 filed Jul. 15, 2003, which application is hereby incorporated by reference in its entirety now U.S. Pat. No. 7,018,862.

FIELD OF THE INVENTION

The present invention relates to a method and apparatus for fabricating micromachined devices. In particular, the present invention relates to a method and apparatus of fabricating piezoelectric based microstructure for micro electromechanical system devices.

BACKGROUND OF THE INVENTION

Piezoelectric materials have great potentials for applications in a variety of micro electromechanical system (MEMS) devices, such as micro sensors, microactuators, micropumps, piezoelectric ink-jet printing heads, etc. In many of these MEMS devices, piezoelectric materials such as piezoelectric thin films are formed on one side of a substrate and the microstructures including a plurality of recesses are formed on the opposite side of the substrate.

A number of methods are used in the art to form piezoelectric thin films, among which the solution spin-coating process is widely used for preparing inorganic piezoelectric films with complex oxide composition and piezoelectric polymers. Inorganic piezoelectric film with complex oxide composition has the best piezoelectric performance than other reported thin films. Solution spin-coating process, including multiple solution spin-coating followed by multiple heat treatment, such as sol-gel and Metallo Organic Decomposition (MOD), possesses great advantages of precise composition control and low cost in obtaining the high performance piezoelectric complex oxide films.

In a conventional method of producing a piezoelectric MEMS device by solution spin-coating process, a piezoelectric thin film is firstly deposited on one side of the substrate, and a desired microstructure is then formed at the opposite side of the substrate by an etching process, such as the wet-etching process. Before the etching process, the piezoelectric films formed on the substrate need to be temporarily protected, so that the highly corrosive etching solution can be prevented from contacting and damaging the piezoelectric films.

There are usually two methods in the art to protect the piezoelectric films during fabrication of the MEMS devices in the etching process. One method is to deposit a thick coating of protective material, such as photosensitive polyimide, wax or the like, onto the piezoelectric films prior to the etching process. Another method is a type of a mechanical protection by using a protective jig to cover the piezoelectric films prior to the etching process.

Both the two methods have drawbacks. In the first method, if the coating is not tightly encapsulated on the piezoelectric films, the etchant may leak into the coating hence damage and/or contaminate the piezoelectric films. In addition, since the coating is formed for the temporarily protection purpose, after the etching process, the coating needs to be removed and therefore, it consumes time, material and labor hence the cost of production is high. Further, the removal of the coating may cause contamination and damage to the piezoelectric films. In the second method, the protective jig may also encounter potential leakage problem due to any imperfect sealing of the protective jig. In addition, since the protective jig needs to be mechanically attached to the piezoelectric film or the substrate, the stress induced by the mechanical attachment may damage the substrate. Moreover, the productivity of this process is very low.

It is therefore a need to provide a method and apparatus of fabricating piezoelectric membrane structure for MEMS devices, in which the piezoelectric film formed on the substrate is well protected from being damaged and/or contaminated during the fabrication process. In the meantime, there is also a need to increase the yield and productivity of micromachined piezoelectric device fabrication.

SUMMARY OF THE INVENTION

In accordance with a first aspect of the present invention, there is provided a method of fabricating a membrane structure for micro-machined devices, the method comprises providing a substrate having a back side, a front side opposite to the back side and a periphery portion. A desired microstructure is formed on the back side of the substrate. A precursor solution is deposited on the front side of the substrate, and the substrate is rotated so that a thin film layer is formed thereon by the precursor solution.

Preferably, the substrate seats with the periphery portion on a base plate so that a spacing is formed between the microstructure and the base plate to leave the microstructure uncontacted from the base plate.

Preferably, the method further comprises seating the periphery portion of the substrate on a ridge projected from the base plate to lift the microstructure from the base plate.

In one embodiment, the method further comprises sealing the periphery portion of the substrate on the base plate via the ridge to isolate the microstructure from the precursor solution.

Preferably, a high-pressure zone surrounding the periphery portion of the substrate is formed during rotation of the substrate to further prevent the precursor solution from contacting the microstructure.

In one embodiment, the method further comprises respectively forming a microstructure on the back side of two substrates. The two substrates are then joint together with the back side facing each other. Afterwards, the jointed two substrates are supported to rotate by firstly exposing the front side of one substrate for a precursor solution deposition so that a thin film layer can be formed thereon. Subsequently, the front side of another substrate is exposed for a precursor solution deposition so that a thin film layer can be formed thereon. Accordingly, a double-sided micromachined device having a joint substrate, a microstructures formed inside the joint substrate and two thin film layers formed at external sides is formed.

In accordance with a second aspect of the present invention, there is provided a substrate support for protecting a microstructure formed on a back side thereof during solution spin deposition. The substrate support comprises a rotatable base plate with a top surface, a seat coupled to the base plate for receiving the substrate over the base plate to form a contacting interface. The contacting interface separates the microstructure from the base plate. The substrate support also has a retaining member coupled to the base plate, whereby the substrate can be secured on the base plate so that the substrate can be rotated by the base plate. Upon seating on the base plate, the microstructure of the substrate is lifted from the base plate via the seat during formation of the thin film. The substrate and the seat form a contacting interface for sealing the microstructure during formation of the thin film.

In one embodiment, the substrate and the base plate form an air gap surrounding the contacting interface for generating a high-pressure zone during rotation of the base plate. The high-pressure zone further prevents the microstructure formed on the back side of the substrate from being contacted.

Preferably, the base plate further comprises a conical side wall extending outwardly and downwardly from the air gap for providing an aerodynamic transition from the high-pressure zone.

In one embodiment, the seat comprises a shoulder projected from a periphery portion of the base plate or a spacer disposed between the substrate and a periphery portion of the base plate for contacting the substrate.

According to the present invention, the temporary protection process for the thin film layers during the MEMS device fabrication process is successfully eliminated, therefore the production efficiency and the yield is greatly increased and the production cost of labor, material or the like is greatly reduced. To meet the requirement of the new process, a supporting apparatus is developed through which the microstructure formed on substrate is effectively protected and in turn, high performance MEMS devices are obtained.

BRIEF DESCRIPTION OF THE DRAWINGS

These and other aspects and advantages of the present invention will be described in detail with reference to the accompanying drawings, in which.

DETAILED DESCRIPTION OF THE PREFERRED EMBODIMENTS

Figure 1A:
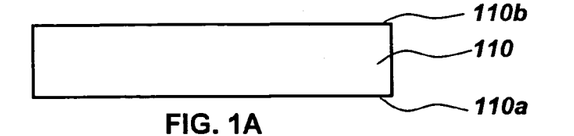
FIGS. 1A to 1H are partial cross sectional views showing a method of fabricating MEMS devices according to one embodiment of the present invention.
Figure 1B:
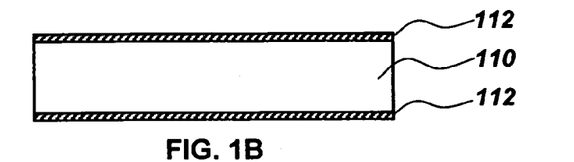

As shown in FIGS. 1A to 1H, a method of fabricating an MEMS device according to one embodiment of the present invention comprises, firstly, providing a substrate 110 which may be of any appropriate material for forming a desired MEMS device thereto, such as a semiconductor silicon wafer. The substrate 110 has a back side 110a on which a microstructure is to be formed, and a front side 110b opposite to the back side 110a, on which a thin film structure, such as a piezoelectric thin film is to be formed. The substrate 110 is thermally oxidized by being heated to a temperature of approximately 1000° C. to 1200° C. so that a silicon oxide layer 112 with a thickness of about 1.2 micrometer (μm) is formed on both the back side 110a and the front side 110b of the substrate 110, as shown in FIG. 1B.

Figure 1C:
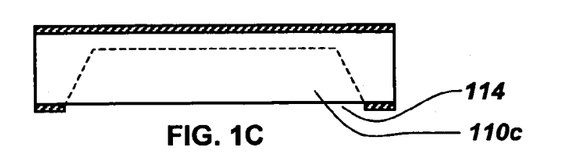

In a next step, a photoresist film (not shown) with a predetermined pattern is formed on the back side 110a and front side 110b of the substrate 110, through a photolithography process. By treating the silicon oxide layer with hydrofluoric acid and an aqueous ammonium fluoride solution, an opening 114 in the silicon oxide layer is formed.

Figure 1D:
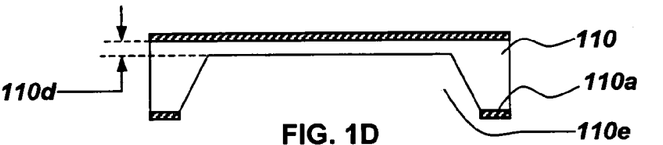

Subsequently, the photoresist film (not shown) is removed, and the substrate 110 is dipped into a solution (not shown) through which the substrate is soluble, such as an aqueous potassium hydroxide solution, therefore the portion 110c of substrate 110 exposed by the opening 114 can be etched off. In one example, the etching rate is about 10 μm per hour at 60° C. temperature. By controlling the etching time, the remaining thickness 110d of the substrate 110 may be formed of about 2 μm to 60 μm thick. Upon completion of this step, a plurality of recesses 110e (only one is shown for illustration) are obtained at the back side 110a of the substrate 110. The recesses 110e form the desired microstructure, as shown in FIG. 1D.

Figure 1E:
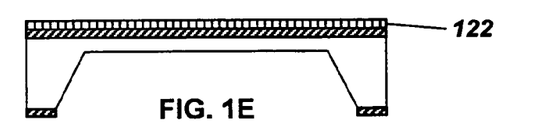
Figure 1F:
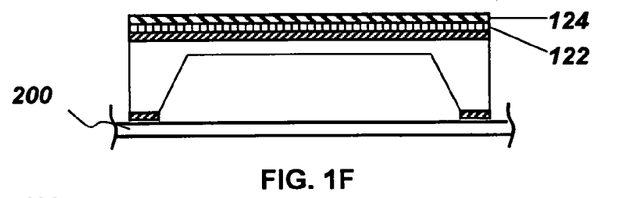

As shown in FIGS. 1E and 1F, an intermediate layer 122 and a first electrode layer 124 are deposited on the front side 110b of the substrate 110 by sputtering. In one embodiment, the intermediate layer 122 is formed of Ti with a thickness of about 50 nm, and the first electrode layer 124 is formed of Pt with a thickness of about 0.5 □m.

Figure 2A:
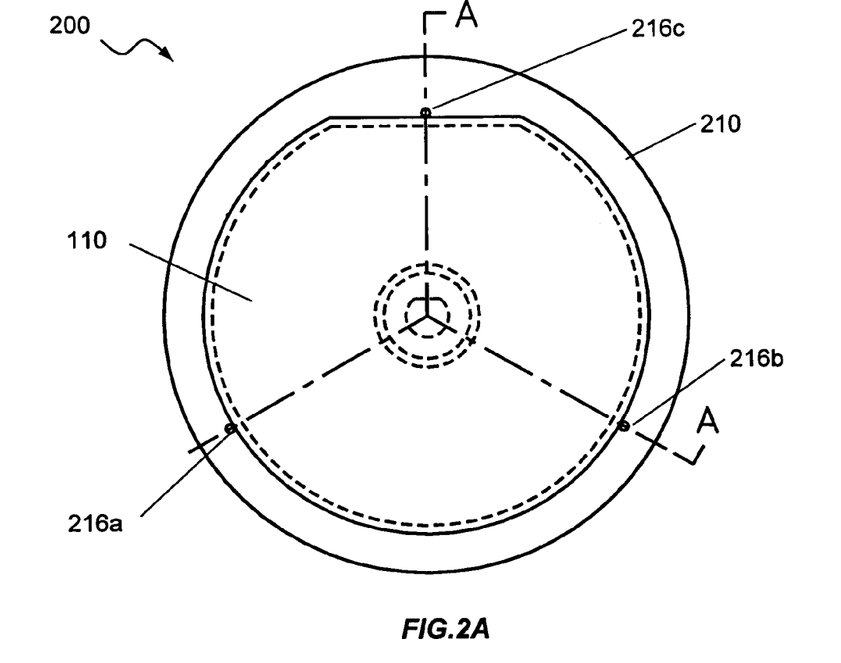
FIG. 2A is a top view showing a substrate being hold by a holder for forming piezoelectric thin film layers according to one embodiment of the present invention.
Figure 2B:
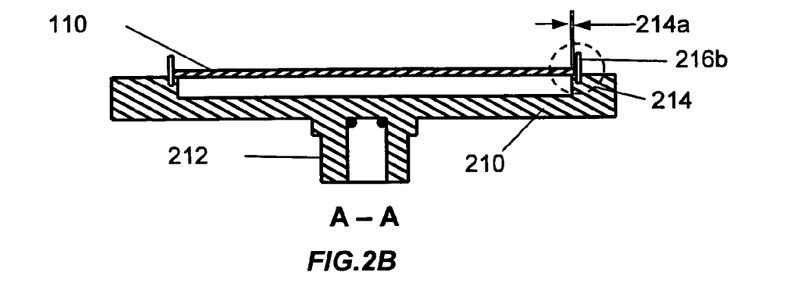
FIG. 2B is the A—A cross sectional side view of FIG. 2A.
Figure 2C:
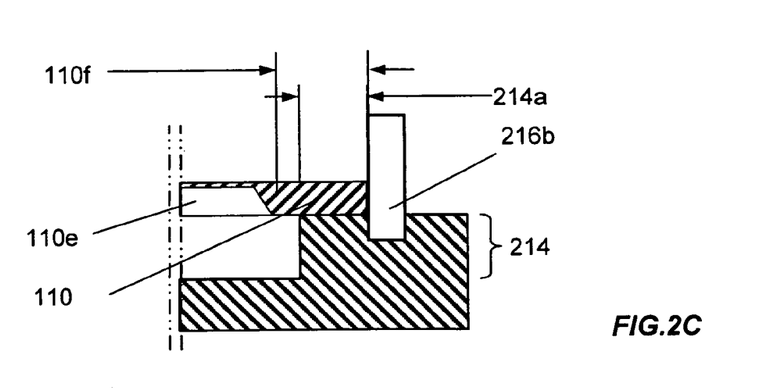
FIG. 2C is a partially enlarged view of FIG. 2B.

To form piezoelectric thin film layers on the front side 110b of the substrate 110, a substrate holder 200 is provided for supporting the substrate 110 during the subsequent spin-coating process to form the piezoelectric thin film. As shown in FIGS. 2A, 2B and 2C in further detail, the substrate holder 200 comprises a base plate 210. The base plate 210 has an adapter 212 formed at the back side for coupling to a rotating machine (not shown). At front side of the base plate 210, there is formed a seat 214 projected upwardly from the periphery portion of the base plate 210. The seat 214 has a dimension 214a corresponding to the periphery portion 110f of the substrate 110 for receiving the substrate 110 thereon.

Upon seating on the base plate 210, the microstructure having the plurality of recesses 110e is held spaced apart from the base plate 210 via the contact between the seat 214 and the periphery portion 110f of the substrate 110. By virtue of this configuration, the microstructure 110e, which is relatively weak in strength and rigidity than the periphery portion 110f, does not contact the base plate 210 during the subsequent steps of the piezoelectric thin film formation.

A retaining member, such as three pins 216a, 216b and 216c coupled to the base plate 210 are provided to surround the substrate 110, as shown in FIGS. 2A and 2B. Two of the pins 216a and 216b are disposed along the periphery edge of the substrate 110, and the third pin 216c is located to engage the primary cut of the substrate 110. Retained by the pins 216a, 216b and 216c, the relative lateral and rotational movement between the substrate 110 and the base plate 210 is prohibited, thereafter the rotation of the base plate 210 can be transferred to the substrate 110 whereby the substrate 110 is rotatable following the rotation of the base plate 210.

Figures 1G, 1H:
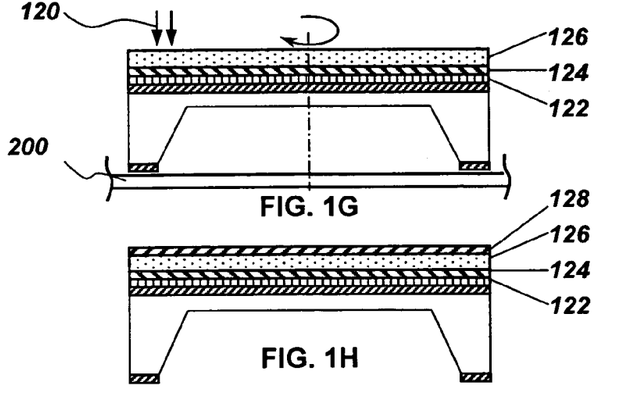

In a next step as shown in FIG. 1G, a piezoelectric precursor solution 120 is applied on the front side 110b of the substrate 110, and the substrate 110 is rotated by the base plate 210, so that a piezoelectric film may be formed on top of the first electrode layer 124. The precursor solution contains compositional elements for forming the piezoelectric film in which the main component is preferred to be Lead-Zirconate-Titanium (Pb—Zr—Ti, or PZT). In one embodiment, the piezoelectric film has a thickness of about 0.5 to 20 □m, and has a composition around the morphotropic phase boundary (MPB), such as Pb(Zr0.52Ti0.48)O3, with about 10–20 atomic % excessive PbO. Details of the preparation of the piezoelectric film are described below.

It should be appreciated that in the step shown in FIG. 1G, the sequence may be that the substrate 110 is rotated first, and followed by application of the precursor solution 120 onto the substrate so that the piezoelectric film is formed onto the substrate during rotation.

A piezoelectric precursor solution with an atomic ratio of Pb:Zr:Ti=1:0.52:0.48 is prepared from lead acetate trihydrate (Pb[CH3COO]2), zirconium propoxide (Zr[OCH(CH3)2]4), and titanium iso-propoxide (Ti[OCH(CH3)2]4). 2-methoxyethanol (CH3OCH2CH2OH) is used as the solvent. The concentration of the solution is 0.4 M. 30% by weight of polyethylene glycol is added into the solution.

In this embodiment, the piezoelectric precursor solution 120 is applied on top of the first electrode layer 124, and the substrate 110 is rotated under a speed of about 4500 rpm for 30 seconds. The precursor solution formed a wet film on the substrate, and is dried at 110° C. for 2 minutes, followed by a pyrolysis process at 410° C. for 10 minutes. The above precursor solution applying, drying and pyrolysis process are repeated for three times, and the film formed are heated at 560° C. for 20 minutes. Further, the precursor solution applying, drying, pyrolysis process and the film-heating process may be repeated for 2 times, and final piezoelectric film formed is annealed at 700° C. for 5 minutes so that a crystallized piezoelectric film 126 with a thickness of about 1.5 □m is obtained.

In a next step as shown in FIG. 1H, a second electrode, such as a Au layer 128 of about 0.2 to 0.3 μm thick is deposited on top of the piezoelectric film 126 by sputtering. The Au layer 128 is patterned by photolithography with a double-side aligner to ensure the alignment with the microstructure formed at the back side of the substrate, followed by an etching process using an aqueous iodine solution and an aqueous potassium iodide solution. The piezoelectric film 126 may be patterned by etching using a HNO3 and HF acid solutions, for example.

To evaluate the performance of the MEMS device formed according to the above method, an electric field of 180 kV/cm is applied to the piezoelectric thin film. Experiments show that the piezoelectric film is effectively poled and exhibits piezoelectric properties. The vibration of a sample MEMS device with a dimension of 4.2 mm×1.35 mm×0.06 mm was detected by a laser vibrometer. Under an applied electrical signal of 5V at 2 kHz, the vibration magnitude of the PZT film is about 24 nm.

Figure 3A:
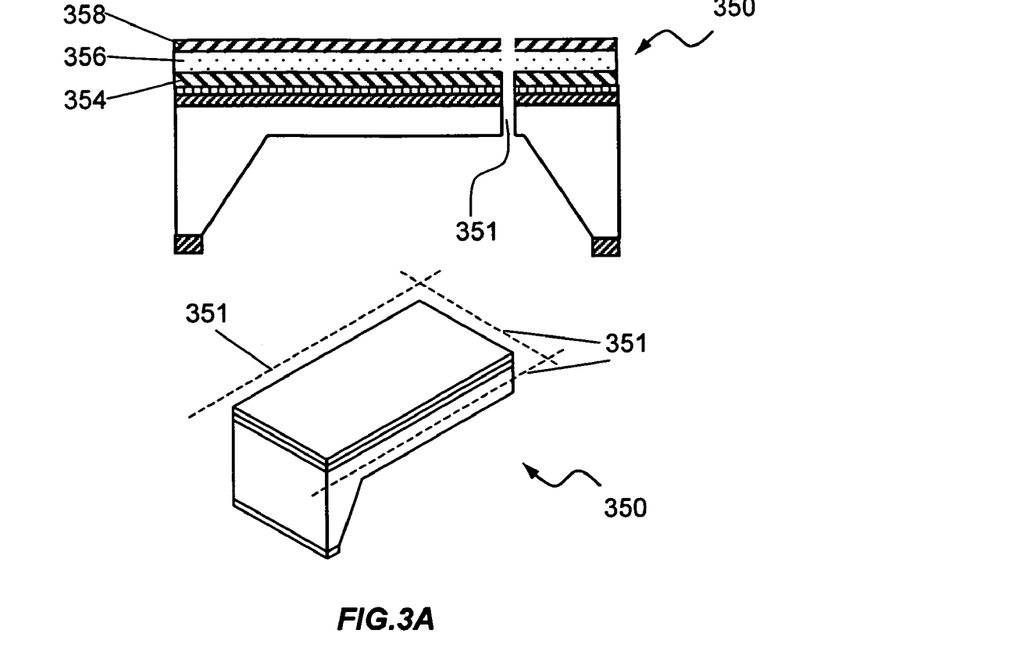
FIGS. 3A and 3B are cross sectional and perspective views showing example MEMS devices formed according to the present invention.

On the basis of the general MEMS devices formed according to the method of the present invention illustrated above, various special types of MEMS devices can be obtained through additional fabrication steps. In one example as shown in FIG. 3A, a piezoelectric cantilever-structured device 350 can be formed through the following etching-through process for the membrane structure. The etching-through process includes etching the top electrode Au layer 358 using an iodine and potassium iodine solution, etching the piezoelectric thin film 356 with a HNO3 and HF acid solution, and etching the bottom electrode 354 and its intermediate layer with an Argon ion-mill process. Reaction ion etching process with CF4 and HBr/Cl2 are used to etch through the SiO2 layer and the thin silicon substrate, respectively. All the above etching process are performed along three sides 351 (only one side is shown) of the membrane structure. After these etching processes, a cantilever-structured device 350 can be obtained.

Figure 3B:
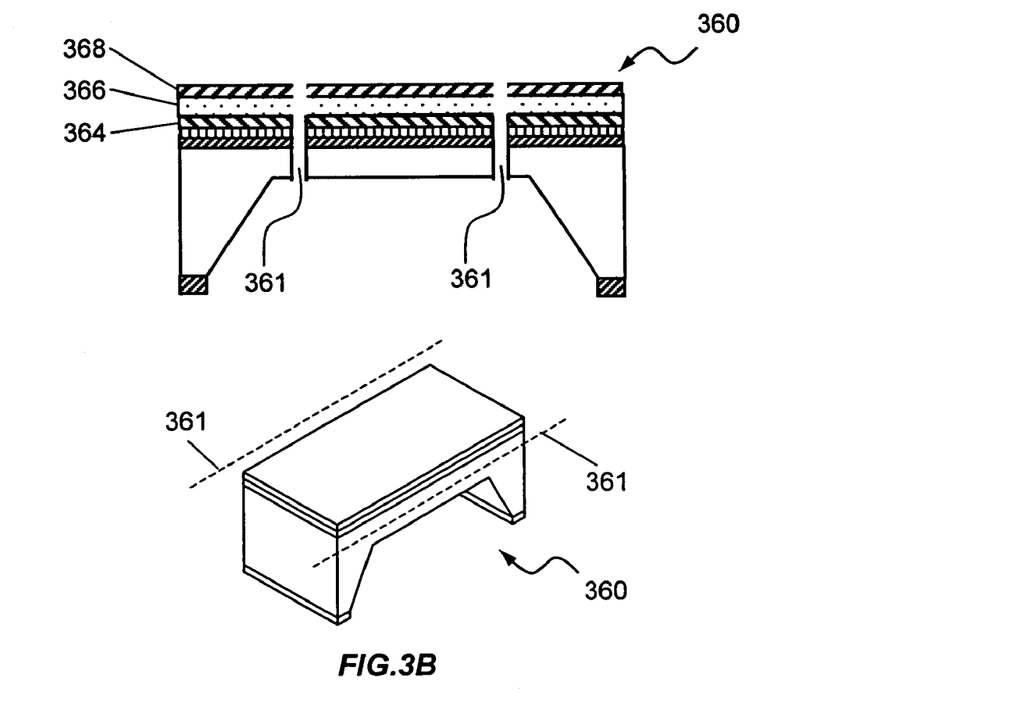

Shown in FIG. 3B, another type of MEMS device, a piezoelectric bridge-structured device 360 can be formed by following the etching-through process for the membrane structure as illustrated above on the top electrode layer 368, the piezoelectric thin film layer 366, the bottom electrode layer 364 and its intermediate layer, the SiO2 layer and the thin silicon substrate, respectively. Instead of etching-through the membrane structure along three sides, all the etching-through steps above are performed along respective two sides 361 of the membrane structure. After these etching processes, a bridge-structured device 360 can be obtained.

Figure 4A:
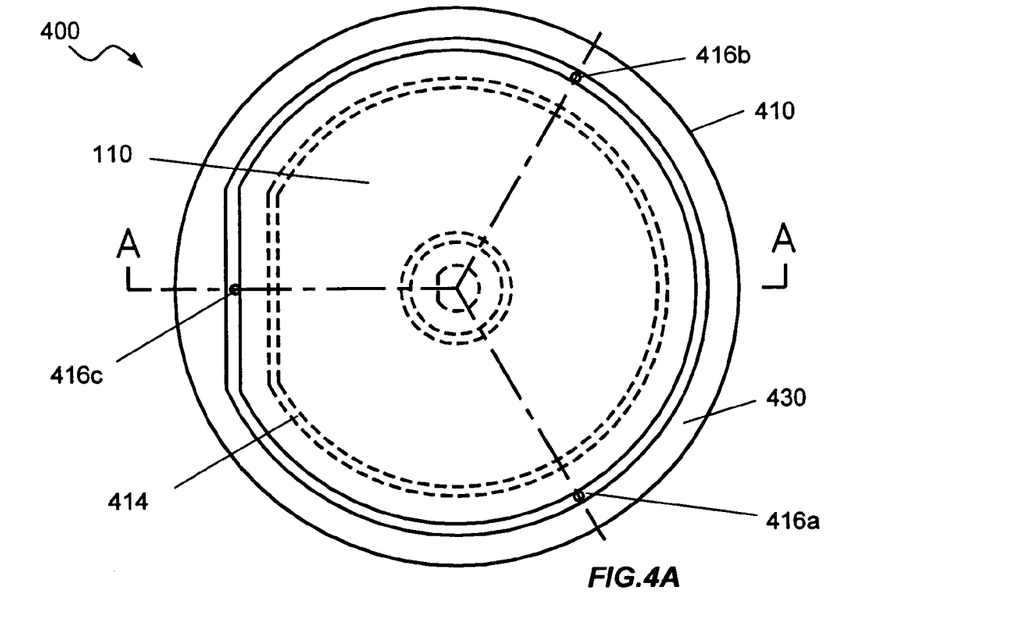
FIG. 4A is a top view showing a holder for forming piezoelectric thin film layers according to another embodiment of the present invention.
Figure 4B:
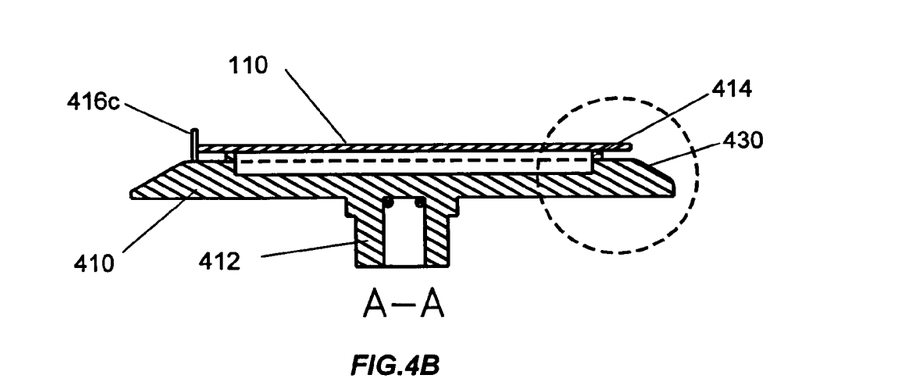
FIG. 4B is the A—A cross sectional side view of FIG. 4A.
Figure 4C:
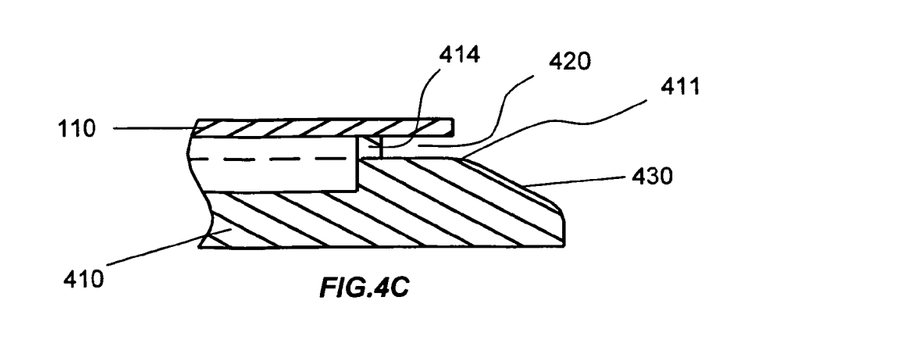
FIG. 4C is a partially enlarged view of FIG. 4B

FIGS. 4A, 4B and 4C show a holder 400 for supporting a substrate to form piezoelectric thin films thereon according to another embodiment of the present invention. The holder 400 comprises a base plate 410 and an adapter 412 formed at the back side of the base plate 410 for attaching to a machine or a drive (not shown) for rotation. A ridge 414 is formed projecting outwardly from the front side of the base plate 410. Alternatively, the ridge may be in a form of a spacer disposed between the substrate and the base plate for the same purpose.

When in use, a substrate 110 having a microstructure formed thereon is seated on the ridge or spacer 414, with the microstructure facing the base plate 410. Lifted by the ridge or spacer 414, the microstructure is positioned space apart from the base plate 410. By virtue of this configuration, the microstructure will be protected during the subsequent steps of the piezoelectric thin film formation. Risks of damage and/or contamination on the microstructure during the thin-film formation can be reduced or prevented. Three holding pines 416a, 416b and 416c are provided to engage to the periphery edge of the substrate 110 to restrain the relative rotation between the substrate 110 and the base plate 410.

An air gap 420 is formed between the periphery portion of the substrate 110 and the front side of the base plate 410. The top surface of the base plate 410 has a smooth aerodynamic transition 411 and an extended conical wall 430 adjacent to the periphery of the substrate 110. During rotation of the base plate 410 and the substrate 110, an air pressure is formed in the gap 420, which is higher than that of the surrounding area. Accordingly, the precursor solution used during the formation of the piezoelectric thin film is further prevented from contacting, damaging and/or contaminating the microstructure.

Figure 5A:
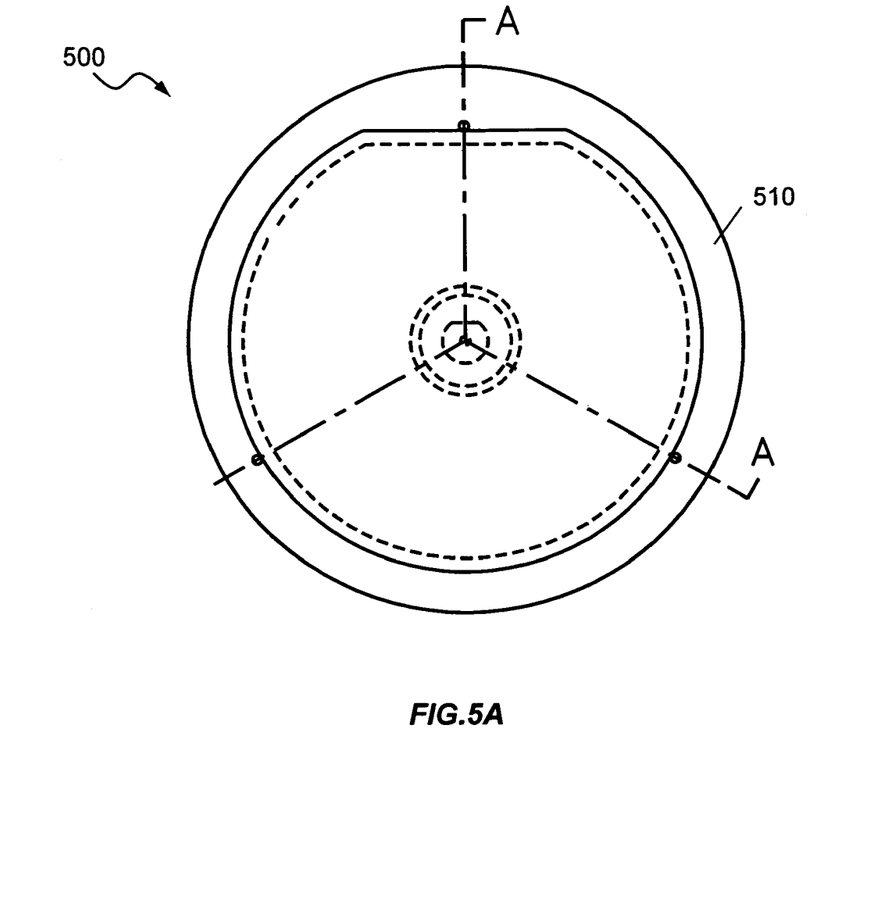
FIG. 5A is a top view showing a holder for forming piezoelectric thin film layers according to a further embodiment of the present invention.
Figure 5B:
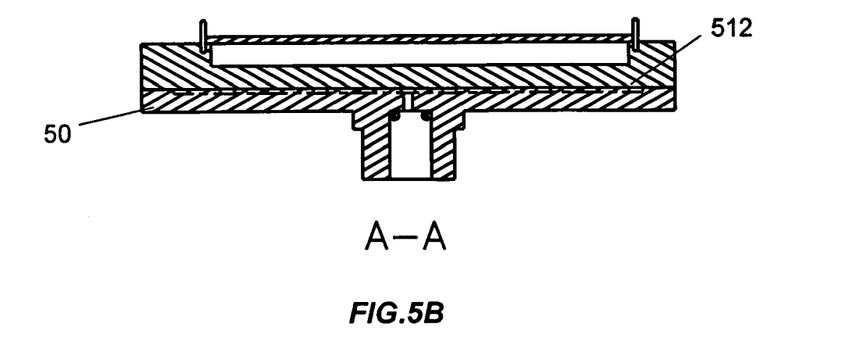
FIG. 5B is the A—A cross sectional side view of FIG. 5A.

FIGS. 5A and 5B show a holder 500 for supporting a substrate to form piezoelectric thin films thereon according to a further embodiment of the present invention. The holder 500 has a base plate 510 with a front-side structure similar to that illustrated in FIG. 2A, 2B or 4A, 4B for receiving and supporting a substrate. The base plate 510 has a flat back side 512. A conventional vacuum spin-chuck 50 can be attached to the base plate 510 via the flat back side 512. The vacuum spin-chuck 50 will carry the holder 500 and further the substrate to rotate for the piezoelectric thin film layers formation.

Figure 6A:
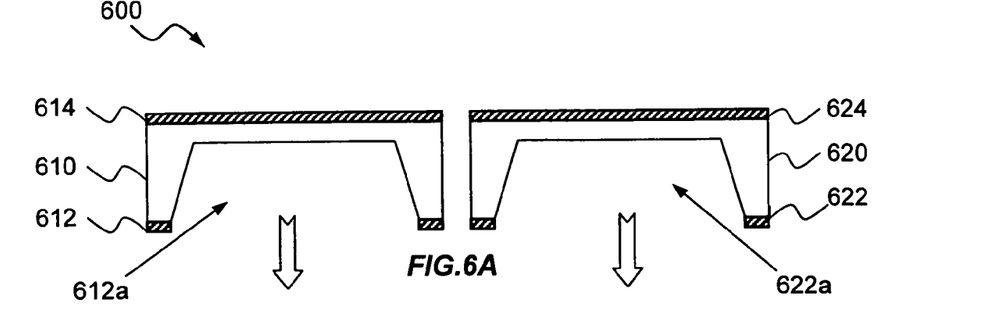
FIGS. 6A–6D are partial cross sectional views showing a method of fabricating MEMS devices according to another embodiment of the present invention.
Figure 6B:
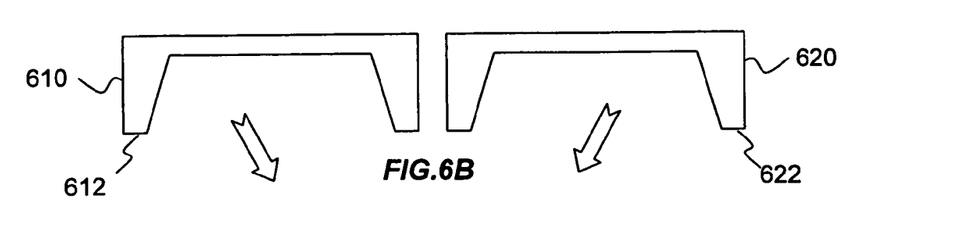

FIGS. 6A–6D show a method 600 of fabricating a MEMS device according to another embodiment of the present invention. Firstly, two substrates 610 and 620 are provided, each substrate has a respective back side 612, 622 and a respective front side 614, 624. Microstructures 612a and 622a are respectively formed on the back side 612 and 614 of each substrate (FIG. 6A). All the silicon oxide layers may be stripped off using HF acid, and the substrate is polished by a chemical mechanical polishing (CMP) process so that to improve the surface roughness (FIG. 6B).

Figure 6C:
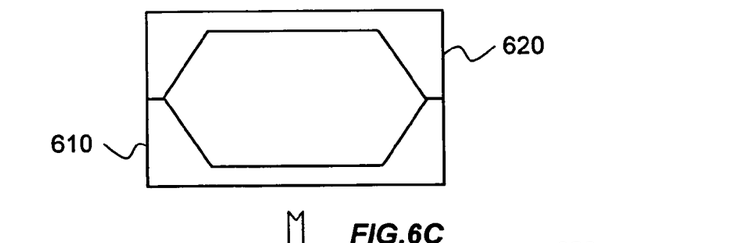

Next, the two substrates 610 and 620 are joint together by facing the back sides 612 and 622 to each other (FIG. 6C). A Si—Si fusion bonding process may be used to joint the two substrate together, which is conducted at about 1050° C. for 4 hours. A joint substrate structure is therefore obtained. In this embodiment, the two substrates are jointed together which can withstand a temperature higher than that used in the subsequent thin-film forming processes.

Figure 6D:
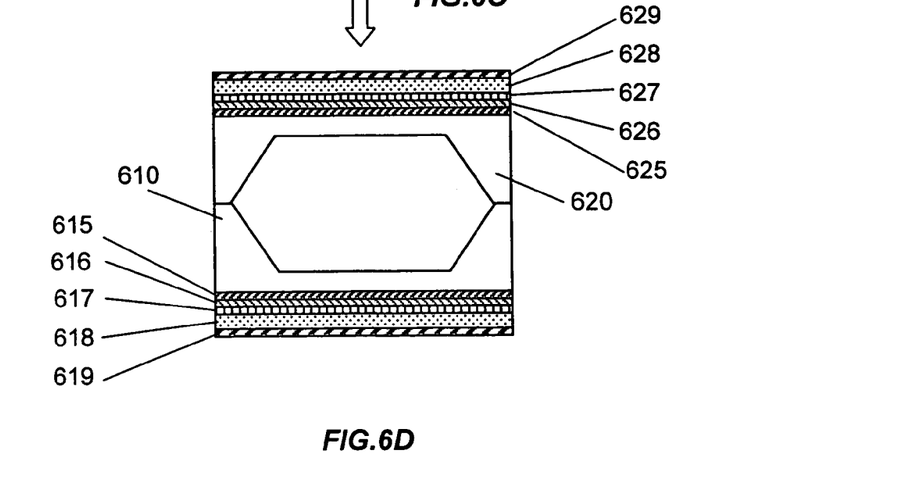

Respective SiO2 layers 615, 625, intermediate layers 616, 626 and first electrodes 617, 627 are formed thereafter on the respective front side 614 and 624 of the first substrate 610 and the second substrate 620. The SiO2 layers are deposited by a plasma enhanced chemical vapor deposition (PECVD) process, and the intermediate layers and the first electrodes are deposited by sputtering (FIG. 6D). The joint first and second substrates is then supported and rotated through which respective piezoelectric films are formed on top of the respective first electrodes 617 and 627. Similar processes of drying, annealing etc. may be conducted as according to the above illustrates in conjunction with FIGS. 1A–1H. The crystallized piezoelectric films 618 and 628 can be formed. Likewise, second electrode 619 and 629 are formed on top of the respective piezoelectric films 618 and 628, so that a double-sided piezoelectric micromachined device can be obtained. Upon completion, the double-sided device comprises a joint substrate with cavities formed therein. The piezoelectric films formed at each side can be independently controlled.

Figure 7:
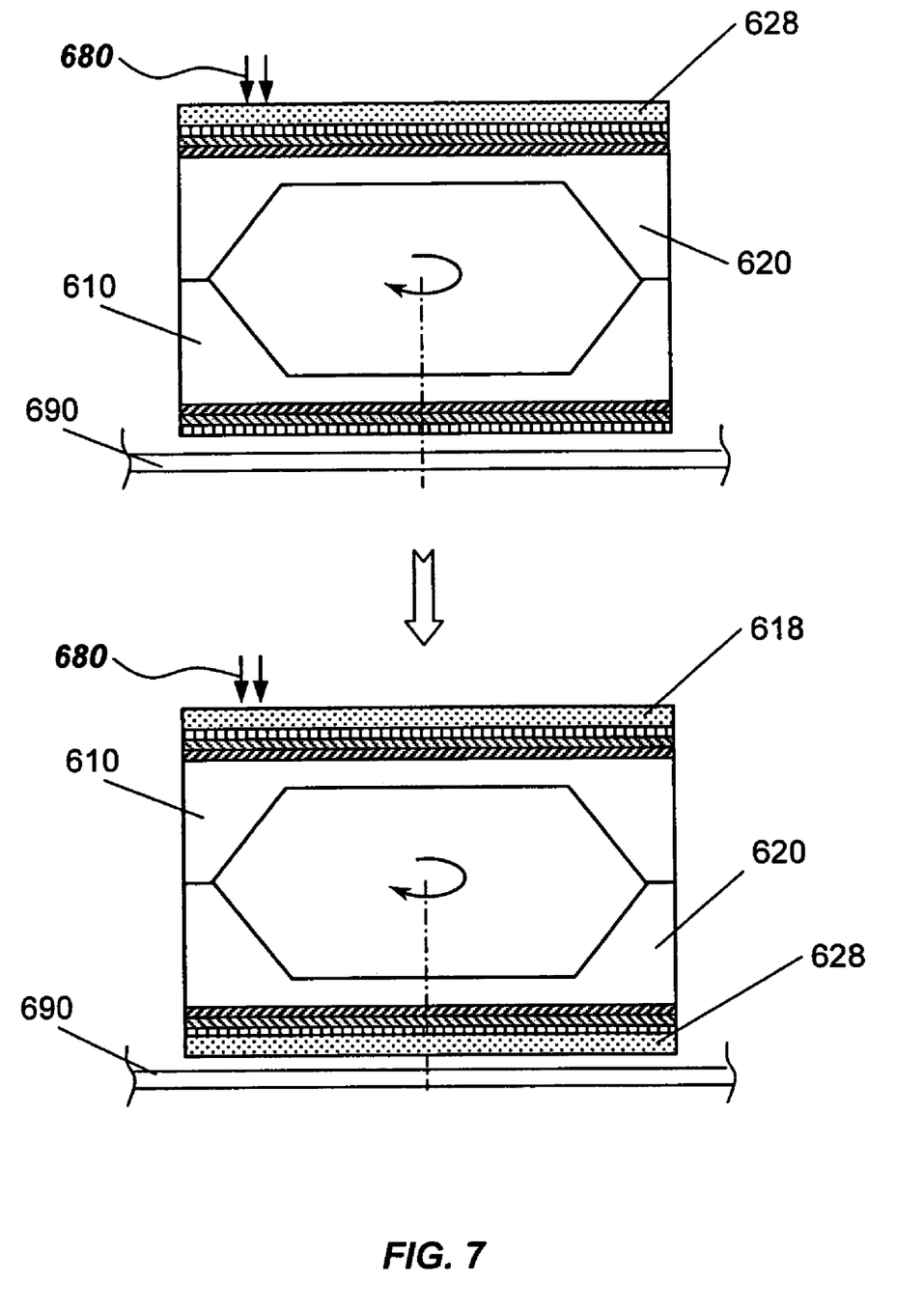
FIG. 7 is a cross sectional view showing a supporting configuration for forming a device as according to FIGS. 6A–6D according to one embodiment of the present invention.

For the purpose of forming the respective piezoelectric films 618 and 628, the holder as illustrated above in conjunction with FIGS. 2A, 2B, 4A, 4B, 5A and 5B may be used for supporting and rotating the substrate. In one embodiment as shown in FIG. 7, the first substrate 610 may be firstly supported by having the front side 614 facing the holder 690, hence to expose the front side 624 of the second substrate 620 for the deposition of the piezoelectric film 628 using a precursor solution 680 during rotation. Thereafter, the second substrate 620 is supported by having the front side 624 facing the apparatus, hence to expose the front side 614 of the first substrate 610 for the deposition of the piezoelectric film 618 using the precursor solution 680 during rotation.

Although embodiments of the present invention have been illustrated in conjunction with the accompanying drawings and described in the foregoing detailed description, it should be appreciated that the invention is not limited to the embodiments disclosed, and is capable of numerous rearrangements, modifications, alternatives and substitutions without departing from the spirit of the invention as set forth and recited by the following claims.

The invention claimed is:

1. A substrate support for protecting a microstructure of a substrate during solution spin deposition, comprising:
    a rotatable base plate having a top surface;
    a seat coupled to the base plate for receiving the substrate to form a contacting interface, wherein the contacting interface is to separate the microstructure from the base plate, and
    a retaining member coupled to the base plate for securing the substrate to the base plate.

2. The substrate support as recited in claim 1, wherein the substrate and the base plate form an air gap surrounding the contacting interface for generating a high-pressure zone during rotation of the base plate to prevent the microstructure on the back side of the substrate from being contacted.

3. The substrate support as recited in claim 2, wherein the base plate further comprises a conical side wall extending outwardly and downwardly from the air gap for providing an aerodynamic transition from the high-pressure zone.

4. The substrate support as recited in claim 1, wherein the seat comprises a shoulder projected from a periphery portion of the base plate for contacting the substrate.

5. The substrate support as recited in claim 1, wherein the seat comprises a spacer disposed between the substrate and a periphery portion of the base plate for contacting the substrate.

6. An MEMS device comprising:
    a substrate having a first side, a second side opposite to the first side and a cavity formed between the first side and the second side;
    a first piezoelectric thin-film structure formed on the first side of the substrate; and
    a second piezoelectric thin-film structure formed on the second side of the substrate.

7. The MEMS device as recited in claim 6, wherein the first and the second piezoelectric thin-film structures are independently controllable.

8. The MEMS device as recited in claim 6, wherein the substrate being silicon wafer substrate.

9. The MEMS device as recited in claim 8, wherein the silicon wafer substrate being formed of two parts jointed at a temperature higher than that for forming the first and second piezoelectric thin-film structures.

* * * * *